United States Patent
Yoshino et al.

(10) Patent No.: US 12,387,949 B2
(45) Date of Patent: *Aug. 12, 2025

(54) SUBSTRATE PROCESSING APPARATUS

(71) Applicant: Kokusai Electric Corporation, Tokyo (JP)

(72) Inventors: Teruo Yoshino, Toyama (JP); Naofumi Ohashi, Toyama (JP); Tadashi Takasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/612,702

(22) Filed: Mar. 21, 2024

(65) Prior Publication Data

US 2024/0234183 A1 Jul. 11, 2024

Related U.S. Application Data

(63) Continuation of application No. 17/205,580, filed on Mar. 18, 2021, now Pat. No. 11,967,513.

(30) Foreign Application Priority Data

Jan. 20, 2021 (JP) ................................ 2021-006865

(51) Int. Cl.
*H01L 21/67* (2006.01)
*F27B 17/00* (2006.01)
(Continued)

(52) U.S. Cl.
CPC .... *H01L 21/67196* (2013.01); *F27B 17/0025* (2013.01); *F27D 3/0084* (2013.01);
(Continued)

(58) Field of Classification Search
CPC ......... H01L 21/67196; H01L 21/67103; H01L 21/67167; H01L 21/67201;
(Continued)

(56) References Cited

U.S. PATENT DOCUMENTS

2003/0215573 A1 11/2003 Nishibayashi
2004/0166697 A1 8/2004 Wang et al.
(Continued)

FOREIGN PATENT DOCUMENTS

JP 2001-338967 A 12/2001
JP 2008-251631 A 10/2008
JP 2016-004834 A 1/2016

OTHER PUBLICATIONS

Taiwanese Office Action issued on Oct. 4, 2021 for Taiwanese Patent Application No. 110103781.
(Continued)

*Primary Examiner* — Glenn F Myers
(74) *Attorney, Agent, or Firm* — Volpe Koenig

(57) ABSTRACT

Described herein is a technique capable of reducing an amount of moisture in a low temperature region in a substrate processing apparatus provided with a transfer chamber. According to one aspect of the technique, there is provided a substrate processing apparatus including: a process chamber provided with a heater; a load lock chamber; a transfer chamber provided between the process chamber and the load lock chamber and including a first region provided adjacent to the process chamber and a second region provided more adjacent to the load lock chamber than the first region and whose temperature is lower than a temperature of the first region; a detector capable of detecting an amount of moisture in the transfer chamber; and an inert gas supplier capable of supplying an inert gas toward the second region in the transfer chamber.

20 Claims, 11 Drawing Sheets

(51) Int. Cl.
    *F27D 3/00*    (2006.01)
    *F27D 9/00*    (2006.01)
(52) U.S. Cl.
    CPC .. *H01L 21/67103* (2013.01); *H01L 21/67167* (2013.01); *H01L 21/67201* (2013.01); *H01L 21/67242* (2013.01); *F27D 2009/0013* (2013.01)
(58) Field of Classification Search
    CPC ........... H01L 21/67242; F27B 17/0025; F27D 3/0084; F27D 2009/0013
    See application file for complete search history.

(56)          References Cited

U.S. PATENT DOCUMENTS

| | | |
|---|---|---|
| 2006/0196023 A1 | 9/2006 | Lee |
| 2009/0142163 A1 | 6/2009 | Genetti et al. |
| 2010/0202093 A1 | 8/2010 | Yamawaku et al. |
| 2017/0062254 A1 | 3/2017 | Hirochi |
| 2019/0148177 A1 | 5/2019 | Yin et al. |
| 2019/0362989 A1 | 11/2019 | Reuter et al. |
| 2019/0390343 A1 | 12/2019 | Min et al. |
| 2020/0194296 A1 | 6/2020 | Numakura et al. |

OTHER PUBLICATIONS

State Intellectual Property Office of China Office Action Issued on Jan. 17, 2025 for Chinese Patent Application No. 202110293140.2.

186

186

SUBSTRATE PROCESSING APPARATUS

CROSS-REFERENCE TO RELATED PATENT APPLICATION

This non-provisional U.S. patent application is a continuation of and claims priority to U.S. patent application Ser. No. 17/205,580, filed Mar. 18, 2021, which claims priority under 35 U.S.C. § 119 of Japanese Patent Application No. 2021-006865, filed on Jan. 20, 2021, in the Japanese Patent Office, the entire contents of which are hereby incorporated by reference.

BACKGROUND

1. Field

The present disclosure relates to a substrate processing apparatus.

2. Related Art

As an apparatus of manufacturing a semiconductor device, an apparatus including a process chamber in which a substrate is processed and a transfer chamber in which a robot capable of transferring the substrate is provided may be used. When a substance unrelated to a substrate processing is present in the transfer chamber (for example, moisture is present in the transfer chamber), a yield may be reduced. Therefore, an amount of a foreign matter such as the moisture in the transfer chamber should be reduced. According to some related arts, the entirety of the transfer chamber is heated to remove the moisture.

The moisture may be abundant in a low temperature region of the transfer chamber. Then, when trying to process the transfer chamber as described above (for example, by heating the entirety of transfer chamber), the moisture may not be completely removed.

SUMMARY

Described herein is a technique capable of reducing an amount of moisture in a low temperature region in a substrate processing apparatus provided with a transfer chamber.

According to one aspect of the technique of the present disclosure, there is provided a substrate processing apparatus including: a process chamber provided with a heater; a load lock chamber; a transfer chamber provided between the process chamber and the load lock chamber and including a first region provided adjacent to the process chamber and a second region provided more adjacent to the load lock chamber than the first region and whose temperature is lower than a temperature of the first region; and an inert gas supplier capable of supplying an inert gas toward the second region in the transfer chamber.

DETAILED DESCRIPTION

Embodiments

Figure 1:
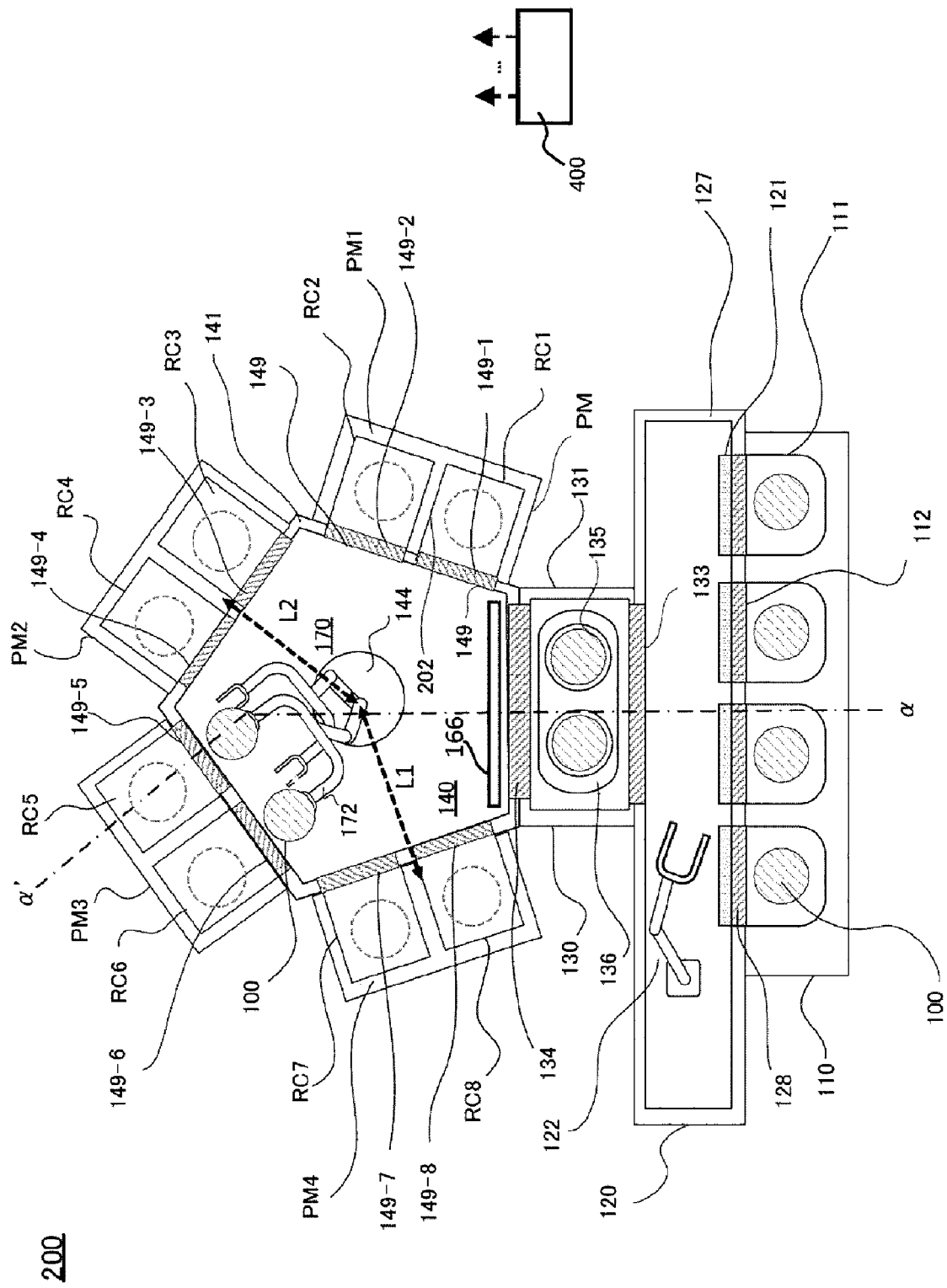
FIG. 1 schematically illustrates a horizontal cross-section of a substrate processing apparatus according to a first embodiment described herein.

Hereinafter, one or more embodiments (also simply referred to as "embodiments") according to the technique of the present disclosure will be described with reference to the drawings.

First Embodiment

Hereinafter, a first embodiment according to the technique of the present disclosure will be described.
(1) Configuration of Substrate Processing Apparatus A substrate processing apparatus according to the first embodiment will be described with reference to FIGS. 1 through 6. The drawings used in the following descriptions are all schematic. For example, a relationship between dimensions of each component and a ratio of each component shown in the drawings may not always match the actual ones. Further, even between the drawings, the relationship between the dimensions of each component and the ratio of each component may not always match.

Figure 2:
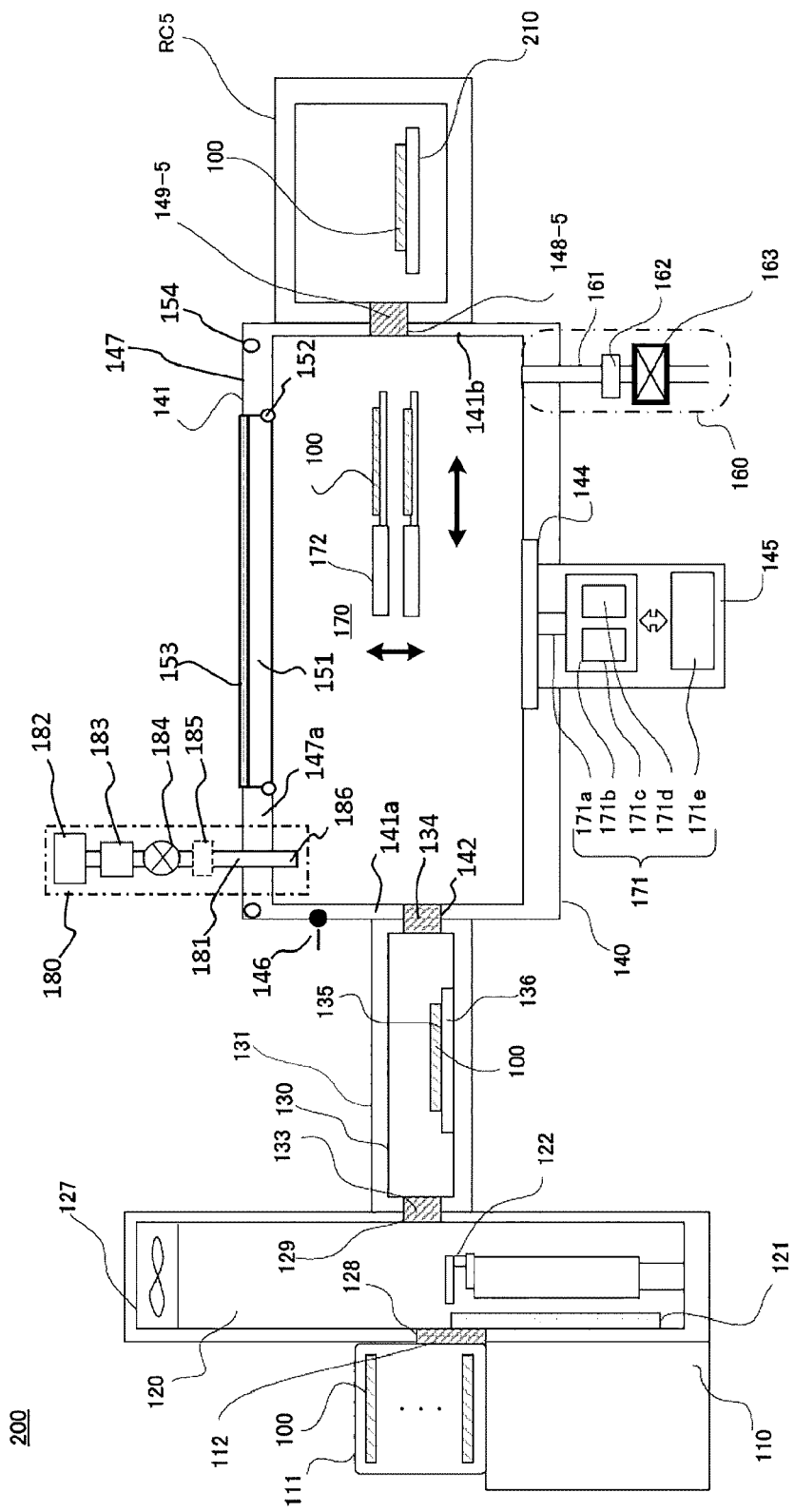
FIG. 2 schematically illustrates a vertical cross-section of the substrate processing apparatus according to the first embodiment described herein.
Figure 3A:
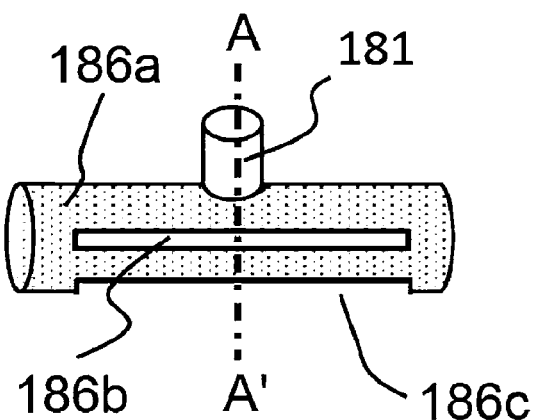
FIGS. 3A and 3B schematically illustrate a distributor of the substrate processing apparatus according to the first embodiment described herein.
Figure 3B:
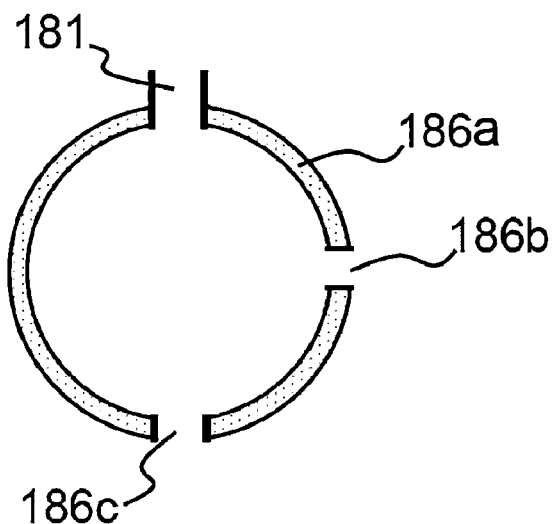
Figure 4:
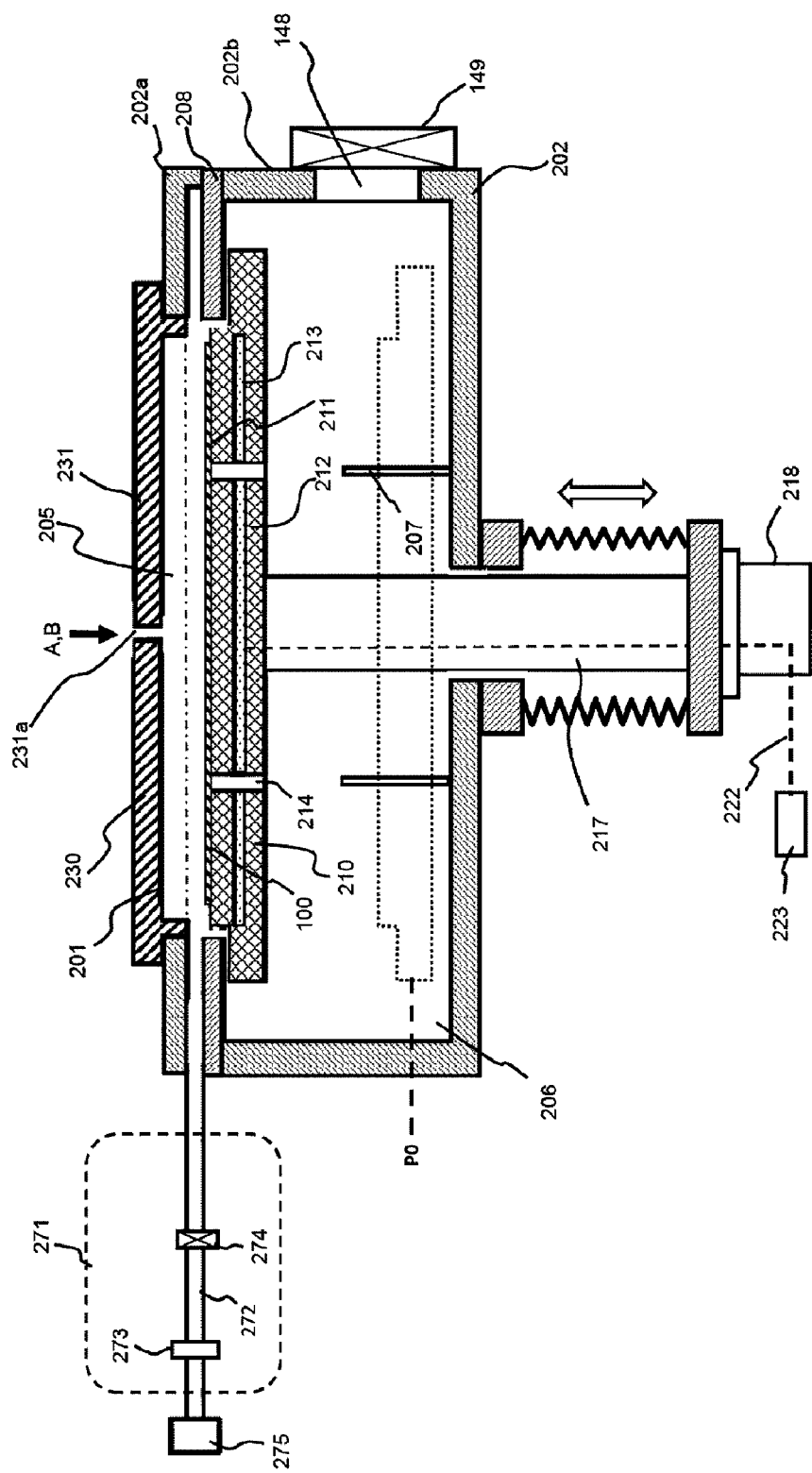
FIG. 4 schematically illustrates a vertical cross-section of a reactor (RC) of the substrate processing apparatus according to the first embodiment described herein.
Figure 5:
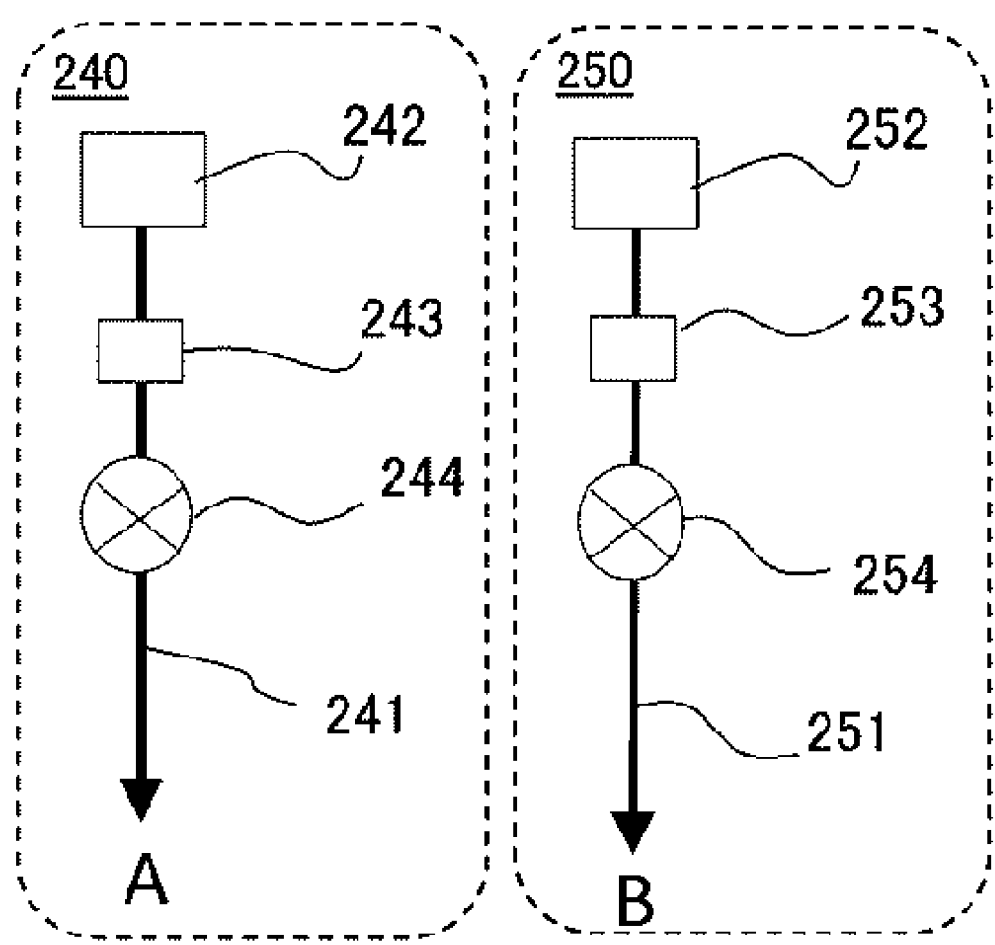
FIG. 5 schematically illustrates a gas supplier of the substrate processing apparatus according to the first embodiment described herein.
Figure 6:
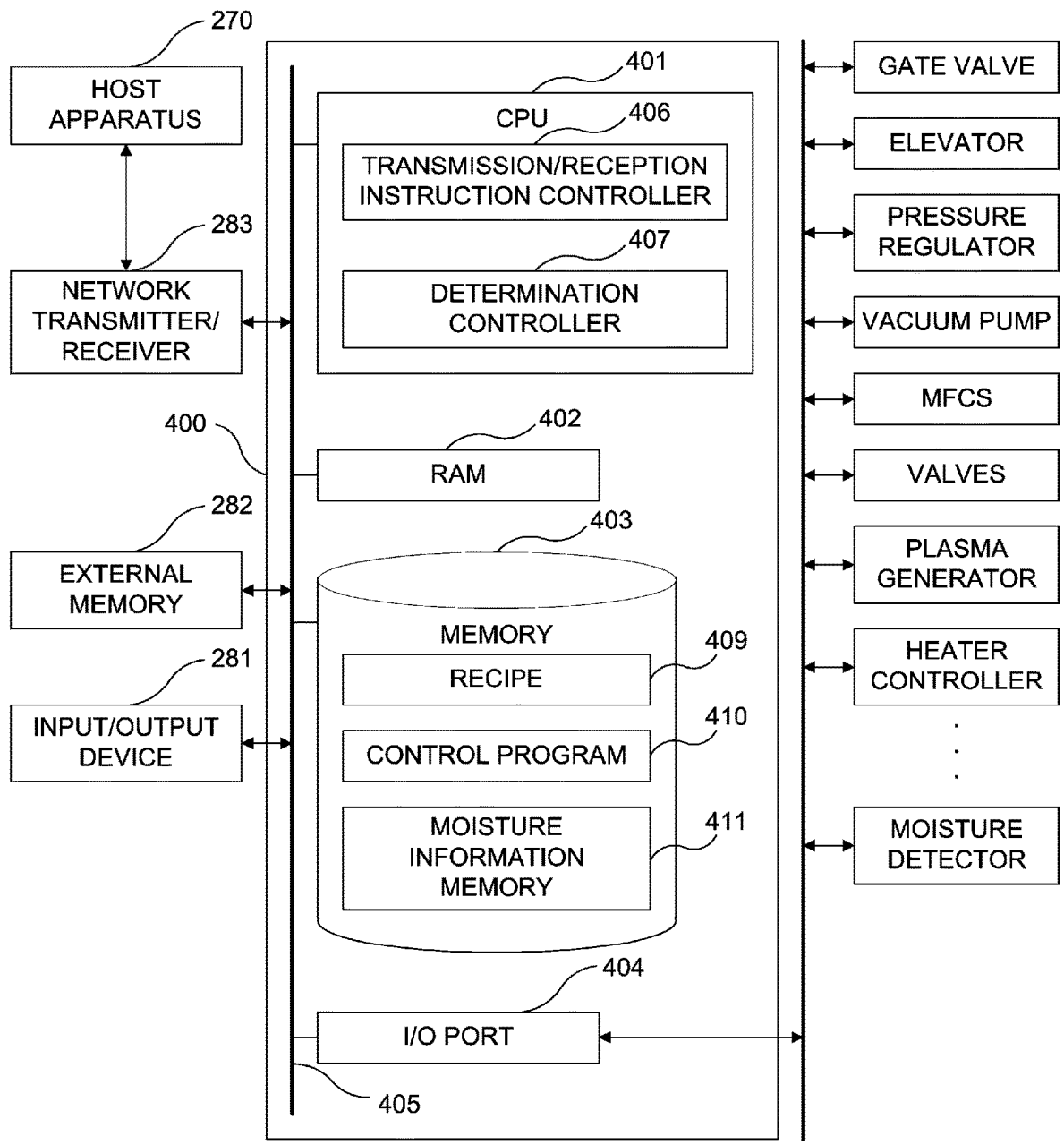
FIG. 6 schematically illustrates a configuration of a controller of the substrate processing apparatus and related components of the substrate processing apparatus according to the first embodiment described herein.

FIGS. 1 and 2 schematically illustrate the substrate processing apparatus according to the first embodiment, and FIGS. 3A and 3B schematically illustrate a distributor of an inert gas supplier provided in a transfer chamber of the substrate processing apparatus according to the first embodiment. FIGS. 4 and 5 schematically illustrate a reactor (RC) of the substrate processing apparatus according to the first embodiment. FIG. 6 schematically illustrates a configuration of a controller of the substrate processing apparatus and related components of the substrate processing apparatus according to the first embodiment. Each configuration will be described below in detail.

The configuration of the substrate processing apparatus will be described with reference to FIGS. 1 and 2. FIG. 1 schematically illustrates a horizontal cross-section of an exemplary configuration of the substrate processing apparatus. FIG. 2 schematically illustrates a vertical cross-section of the exemplary configuration of the substrate processing apparatus taken along the line α-α' in FIG. 1.

A substrate processing apparatus 200 according to the first embodiment is configured to process a plurality of substrates including a substrate 100. Hereinafter, the plurality of the substrates including the substrate 100 may also be simply referred to as substrates 100. The substrate processing apparatus 200 includes an I/O stage (input/output stage) 110, an atmospheric transfer chamber 120, a load lock chamber 130, a vacuum transfer chamber 140 and a plurality of process modules (hereinafter, also simply referred to as "PMs") such as process modules PM1, PM2, PM3 and PM4. Hereinafter, one of the process modules PM1, PM2, PM3 and PM4 may be referred to as a "process module PM", and the process modules PM1, PM2, PM3 and PM4 may be collectively referred to as "process modules PMs".

<Atmospheric Transfer Chamber and I/O Stage>

The I/O stage (also referred to as a "loading port shelf") 110 is provided in front of the substrate processing apparatus 200. The I/O stage 110 is configured such that a plurality of pods including a pod 111 can be placed on the I/O stage 110. Hereinafter, the plurality of the pods including the pod 111 may also be simply referred to as pods 111. The pod 111 is used as a carrier for transferring the substrate (wafer) 100 such as a silicon (Si) substrate.

The substrates 100 managed on a lot basis can be stored in the pod 111. For example, n substrates (n is a natural number) are stored in the pod 111 as the substrates 100.

A cap 112 is installed at the pod 111. The cap 112 is opened or closed by a pod opener 121. The pod opener 121 is configured to open and close the cap 112 of the pod 111 placed on the I/O stage 110. When the pod opener 121 opens a substrate entrance (not shown) of the pod 111, the substrates 100 may be loaded into or unloaded out of the pod 111. The pod 111 is provided to or discharged from the I/O stage 110 by an automated material handling systems (AMHS) (not shown).

The I/O stage 110 is provided adjacent to the atmospheric transfer chamber 120. The load lock chamber 130, which will be described later, is connected to a side of the atmospheric transfer chamber 120 other than a side at which the I/O stage 110 is provided. An atmospheric transfer robot 122 capable of transferring the substrates 100 is provided in the atmospheric transfer chamber 120.

A communication hole 128 configured to transfer the substrates 100 into or out of the atmospheric transfer chamber 120 and the pod opener 121 are provided at a front side of a housing 127 of the atmospheric transfer chamber 120. A communication hole 129 configured to transfer the substrates 100 into or out of the load lock chamber 130 is provided at a rear side of the housing 127 of the atmospheric transfer chamber 120. When the communication hole 129 is opened by a gate valve 133, the substrates 100 may be loaded into the load lock chamber 130 or unloaded out of the load lock chamber 130.

<Load Lock Chamber>

The load lock chamber 130 is provided adjacent to the atmospheric transfer chamber 120. The vacuum transfer chamber 140, which will be described later, is provided at a side of a housing 131 constituting the load lock chamber 130 other than a side of the housing 131 that is adjacent to the atmospheric transfer chamber 120.

A substrate mounting table 136 provided with at least two placing surfaces 135 is provided in the load lock chamber 130. A distance between the two placing surfaces 135 may be set based on a distance between end effectors of an arm of a robot 170 which will be described later.

<Vacuum Transfer Chamber>

The substrate processing apparatus 200 includes the vacuum transfer chamber (also referred to as a "transfer module") 140, that is, a transfer space in which the substrates 100 are transferred under a negative pressure. The vacuum transfer chamber 140 may also be simply referred to as a "transfer chamber 140". For example, a housing 141 constituting the vacuum transfer chamber 140 is pentagonal when viewed from above. The load lock chamber 130 and the process modules PM1, PM2, PM3 and PM4 where the substrates 100 are processed are connected to respective sides of the housing 141 of a pentagonal shape. The robot 170 capable of transferring the substrates 100 under the negative pressure is provided at approximately at a center of the vacuum transfer chamber 140 with a flange 144 as a base. The robot 170 serves as a transfer device.

The load lock chamber 130 and the vacuum transfer chamber 140 are communicated with each other through a communication hole 142. The communication hole 142 is opened or closed by a gate valve 134.

The robot 170 provided in the vacuum transfer chamber 140 may be elevated and lowered by an elevator 145 while maintaining the vacuum transfer chamber 140 airtight by the flange 144. The elevator 145 is configured to elevate and lower two arms including an arm 172 of the robot 170. In FIG. 2, for convenience of explanation, the end effectors of the arm 172 are illustrated, and components such as a link structure between the end effectors and the flange 144 are omitted.

The reactor (hereinafter, also referred to as an "RC") are provided in each of the process modules PM1, PM2, PM3 and PM4 adjacent to the vacuum transfer chamber 140. Specifically, reactors RC1 and RC2 are provided in the process module PM1. Reactors RC3 and RC4 are provided in the process module PM2. Reactors RC5 and RC6 are provided in the process module PM3. Reactors RC7 and RC8 are provided in the process module PM4. Hereinafter, one of the reactors RC1 through RC8 may be referred to as a "reactor RC", and the reactors RC1 through RC8 may be collectively referred to as "reactors RCs".

A communication hole such as a communication hole 148 shown in FIG. 4 is provided in each of sidewalls of the housing 141 facing the reactors (RCs) RC1 through RC8, respectively. For example, a communication hole 148-5 is provided in the sidewall of the housing 141 facing the reactor RC5 as shown in FIG. 2. A gate valve such as a gate valve 149 shown in FIG. 4 is provided in each of the reactors (RCs) RC1 through RC8. For example, a gate valve 149-5 is provided in the sidewall of the housing 141 facing the reactor RC5 as shown in FIG. 2. Hereinafter, the communication hole including the communication hole 148 may also be collectively or individually referred to as the communication hole 148, and the gate valve including the gate valve 149 may also be collectively or individually referred to as the gate valve 149. Since the configurations of the reactors RC1 through RC4 and RC6 through RC8 are the same as that of the reactor RC5, the detailed description thereof will be omitted.

An arm controller 171 capable of controlling an elevating operation and a rotating operation of the arm 172 is embedded in the elevator 145. The arm controller 171 mainly includes a support shaft 171a configured to support a shaft of the arm 172 and an actuator 171b configured to elevate or rotate the support shaft 171a.

The actuator 171b may include an elevator 171c such as a motor configured to elevate and lower the support shaft 171a and a rotator 171d such as a gear configured to rotate the support shaft 171a. The elevator 145 may further include an instruction controller 171e which is a part of the arm controller 171 and configured to control the actuator 171b to move the support shaft 171a up and down or to rotate the support shaft 171a. The instruction controller 171e may be electrically connected to a controller 400 described later. The actuator 171b may be controlled by the instruction controller 171e based on an instruction from the controller 400.

The arm 172 can be rotated and stretched about the shaft. As described above, a shaft of the robot 170 is arranged approximately at a center of the housing 141. However, a distance from a center of the shaft to a substrate mounting table 212 (described later) of each of the reactors (RCs) may differ due to a structural restriction. For example, in FIG. 1, a distance L1 from the center of the shaft of the robot 170 to the substrate mounting table 212 of the reactor RC8 (or RC7) is shorter than a distance L2 from the center of the shaft of the robot 170 to the substrate mounting table 212 of the reactor RC4 (or RC3).

By rotating and stretching the robot 170, the substrate 100 can be transferred into or out of the reactors RCs. As described above, distances between each of the reactors RCs and the shaft of the robot 170 are different for each of the reactors RCs. The robot 170 can transfer the substrate 100 to the reactor RC, for example, in accordance with an instruction from the controller 400.

Subsequently, an exhauster (which is an exhaust system) 160 will be described. The exhauster 160 is provided below the housing 141. Specifically, for example, an exhaust pipe 161 is connected to a bottom wall of the housing 141. An APC (Automatic Pressure Controller) 162 is provided at the exhaust pipe 161. The APC 162 serves as a pressure controller (pressure regulator) capable of controlling an inner atmosphere of the housing 141 to a predetermined pressure. The APC 162 includes a valve body (not shown) whose opening degree can be adjusted. The APC 162 can adjust the conductance of the exhaust pipe 161 in accordance with an instruction from the controller 400. Further, a valve 163 is provided at the exhaust pipe 161. The exhaust pipe 161, the APC 162 and the valve 163 may be collectively referred to as a "transfer chamber exhauster".

Further, a dry pump DP (not shown) is provided at a downstream side of the exhaust pipe 161. The dry pump is capable of exhausting the inner atmosphere of the housing 141 through the exhaust pipe 161.

A moisture detector 146 is provided in the housing 141 constituting the vacuum transfer chamber 140. The moisture detector 146 is electrically connected to the controller 400. The moisture detector 146 is capable of detecting an amount of moisture (water vapor) in the vacuum transfer chamber 140 and transmitting the detected amount of the moisture to the controller 400. The moisture detector 146 may also be simply referred to as a "detector".

For the reason described later, the moisture detector 146 is provided at a location at which the amount of the moisture in the vacuum transfer chamber 140 can be detected. In the present specification, the "location at which the amount of the moisture in the vacuum transfer chamber 140 can be detected" may refer to a low temperature location, for example, the vicinity of a ceiling 147 of the housing 141 and the vicinity of a side wall 141a (described later) provided adjacent to the load lock chamber 130.

A window 151 is provided on the ceiling 147. The window 151 is used to confirm whether or not an operation of the robot 170 is normal. An O-ring 152 serving as a seal is arranged between the window 151 and a wall 147a constituting the ceiling 147. For example The O-ring 152 is made of a material such as rubber. As a result, the inner atmosphere of the vacuum transfer chamber 140 is sealed. A lid 153 is provided on the window 151.

A flow path 154 configured to flow cooling water or a chiller (medium) capable of adjusting a temperature of the housing 141 may be provided at the housing 141. With such a structure, even when the housing 141 is affected by a heater 213 (see FIG. 4) in the reactor RC, it is possible to suppress an excessive temperature elevation.

An inert gas supplier (which is an inert gas supply system) 180 capable of supplying an inert gas to the low temperature location described later is provided at the housing 141. For example, as shown in FIG. 2, the inert gas supplier 180 may be provided on the ceiling 147. The inert gas supplier 180 includes an inert gas supply pipe 181. An inert gas supply source 182, a mass flow controller (MFC) 183 serving as a flow rate controller (flow rate control structure) and a valve 184 serving as an opening/closing valve are sequentially provided in order at the inert gas supply pipe 181 from an upstream side toward a downstream side of the inert gas supply pipe 181. A heater 185 capable of heating the inert gas supplied in the inert gas supply pipe 181 may be further provided.

A distributor 186 is provided at a tip (front end) of the inert gas supply pipe 181. The distributor 186 is configured to disperse and supply the inert gas into the housing 141.

The inert gas supplier 180 is constituted mainly by the inert gas supply pipe 181, the MFC 183, the valve 184 and the distributor 186. The inert gas supplier 180 may further include the heater 185. Since the inert gas supplier 180 is configured to supply the inert gas to the transfer chamber 140, the inert gas supplier 180 may also be referred to as a "transfer chamber inert gas supplier".

Subsequently, the low temperature location and a high temperature location will be described. For example, the high temperature location may refer to walls such as a wall 141b provided adjacent to the reactor RC5 shown in FIG. 2. When processing the substrates 100, the substrates 100 are heated by heaters such as the heater 213 in the reactor RC shown in FIG. 4. Therefore, the walls adjacent to the reactors RC such as the wall 141b are affected by the heaters such as the heater 213, and temperatures of the walls are higher than that of the side wall (also simply referred to as a wall) 141a provided adjacent to the load lock chamber 130. In the present specification, the high temperature location may refer to a location that becomes hot due to an influence of the heaters of the reactors RCs such as the heater 213. A region including the high temperature location may also be referred to as a "high temperature region" or a "first region".

In the present specification, the low temperature location may refer to a location whose temperature is lower than that of the high temperature location. A region including the low temperature location may also be referred to as a "low temperature region" or a "second region". For example, the low temperature location may refer to the ceiling 147 or the wall 141a of the transfer chamber 140 provided with the communication hole 142, and the low temperature region may refer to the region in which the ceiling 147 or the wall 141a of the transfer chamber 140 is provided. A region in which the O-ring 152 is arranged may also be referred to as the low temperature region. Since the components described above such as the ceiling 147, the wall 141a and the O-ring 152 are located far from the reactors RCs, they are not easily affected by the heaters provided in the reactors RCs such as the heater 213. Therefore, temperatures of the components described above are lower than that of the wall 141b. Further, since an outer shell of the low temperature location such as the ceiling 147 is exposed to an outer atmosphere, a temperature of the outer shell of the low temperature location may become close to the room temperature at which the moisture easily adheres. That is, the moisture may easily adhere to the outer shell of the low temperature location.

It can be said that the high temperature location is provided between the heaters in the reactors RCs (such as the heater 213) and the low temperature location. It can be said that the low temperature location is provided between the high temperature location and the load lock chamber 130. According to the present embodiment, the "low temperature" may refer to a temperature (for example, less than 100° C.) low enough to allow the moisture to adhere in the transfer chamber 140.

For example, a central portion of the ceiling 147 in the horizontal direction is separated from each of the reactors RCs. Therefore, the central portion of the ceiling 147 is not easily affected by the heat of the heaters such as the heater 213. Similarly, the vicinity of the communication hole 142 is not easily affected by the heat of the heaters such as the heater 213. Therefore, temperatures of the central portion of the ceiling 147 and the vicinity of the communication hole 142 are low.

Further, when the chiller is supplied, the housing 141 is maintained at a temperature (for example, the room temperature) at which the housing 141 can be operated by, for example, a maintenance personnel. Therefore, since the temperature of the housing 141 is stable and low, the moisture is more likely to adhere to the low temperature location.

There is a problem that an amount of the moisture increases in such a low temperature location. The moisture adhering to the low temperature location may adhere to the substrate 100, particularly the processed substrate 100 heated by a substrate processing. Thereby, a natural oxide film may be formed on the substrate 100, and the substrate 100 may be unintentionally modified by components (such as hydrogen (H) and oxygen (O)) of the moisture.

As described above, the distance between each of the reactors RCs and the shaft of the robot 170 is different for each of the reactors RCs. Then, transfer distances of the substrates 100 may also be different for each of the substrates 100. Therefore, a state of each of the substrates 100 (for example, the formation of the natural oxide film and the unintended modification of a film formed on each of the substrates 100) may be different for each of the substrates 100 depending on the reactor RC in which the substrate 100 is processed. Therefore, a yield may be reduced.

In order to address the problem described above, the housing 141 may be heated to remove the moisture. However, when the housing 141 is heated, for example, the O-ring 152 in the ceiling 147 and components constituting the robot 170 may be deteriorated by heating the housing 141. Therefore, it is not preferable to heat the housing 141(that is, the transfer chamber 140).

Therefore, according to the present embodiment, the moisture is removed while maintaining the temperature of the low temperature location low. In order to remove the moisture while maintaining the temperature of the low temperature location low, the inert gas is locally supplied to the low temperature location. Specifically, the distributor 186 is used to locally supply the inert gas to the low temperature location.

Subsequently, a detailed structure of the distributor 186 will be described with reference to FIGS. 3A and 3B. FIG. 3A schematically illustrates the distributor 186 when viewed from the robot 170 toward the wall 141b, and FIG. 3B schematically illustrates a cross-section of the distributor 186 taken along the line A-A' in FIG. 3A.

The distributor 186 is constituted mainly by a main body 186a of a cylindrical shape. The inert gas supply pipe 181 is connected to the main body 186a. A hole 186b serving as an inert gas supply hole is provided on a side of the main body 186a in the direction of the robot 170. A hole 186c serving as an inert gas supply hole may be further provided below the main body 186a.

A height of the hole 186b in a height direction (vertical direction) is set such that the inert gas discharged (ejected) through the hole 186b may collide with the ceiling 147. For example, the hole 186b is provided at a height position between the ceiling 147 and the arm 172 of the robot 170. The arm 172 of the robot 170 is provided higher than the other arms of the robot 170.

The hole 186b may be open in a direction in which the inert gas collides with an inner wall (that is, the wall 147a) of the ceiling 147. By supplying the inert gas toward the ceiling 147, the moisture adhering to the wall 147a of the ceiling 147 collides with the inert gas, so that the moisture can be physically peeled off. Therefore, it is possible to remove the moisture adhering to the wall 147a of the ceiling 147 while maintaining the temperature of the wall 147a or the robot 170 low.

A width of the hole 186b is set such that, for example, the inert gas can be supplied to the O-ring 152 in the horizontal direction. Specifically, the width of the hole 186b is set to be equal to or greater than a diameter of the O-ring 152. Thereby, the moisture adhering to the periphery of the O-ring 152 can collide with the inert gas, and the moisture can be physically peeled off. Therefore, it is possible to remove the moisture without thermally deforming the O-ring 152. The present embodiment is described by way of an example in which the hole 186b is configured as a single slit shape. However, the present embodiment is not limited thereto. For example, the hole 186b may be configured as a plurality of holes. When the hole 186b is configured as the plurality of holes, a distance between outermost holes among the plurality of the hole is set to be equal to or greater than the diameter of the O-ring 152.

The hole 186c is provided below the main body 186a. The inert gas supplied through the hole 186c is supplied toward the wall 141a adjacent to the load lock chamber 130. The reason for supplying the inert gas to the wall 141a will be described below. The unprocessed substrates 100 stored in the pod 111 may be transferred to various places in a factory where the substrate processing apparatus 200 is installed. Therefore, the moisture may adhere to the unprocessed substrates 100 before the unprocessed substrates 100 are transferred to the substrate processing apparatus 200. The moisture adhering to the unprocessed substrates 100 may be diffused into the vacuum transfer chamber 140 when the unprocessed substrates 100 are transferred to the vacuum transfer chamber 140 from the load lock chamber 130. In particular, the moisture may tend to adhere to the wall 141a arranged in the vicinity of the communication hole 142.

On the other hand, by supplying the inert gas supplied through the hole 186c toward the wall 141a, the moisture adhering to the wall 141a may collide with the inert gas, and the moisture can be physically peeled off. Therefore, it is possible to efficiently remove a large amount of the moisture adhering to the wall 147a while maintaining the temperature of the wall 147a or the robot 170 low.

Since the moisture adhering to the unprocessed substrates 100 passing through the load lock chamber 130 is diffused around the communication hole 142, it is preferable that a width of the hole 186c parallel to the wall 141a is set to be equal to or greater than a width of the communication hole 142. Therefore, by setting the width of the hole 186c equal to the width of the communication hole 142, it is possible to reliably supply the inert gas to the moisture adhering to a portion of the wall 141a around the communication hole 142. Further, by setting the width of the hole 186c greater than the width of the communication hole 142, it is possible to reliably supply the inert gas to the moisture adhering to a side portion of the wall 141a around a side portion of the communication hole 142.

A maximum width of the hole 186c in the direction parallel to the wall 141a is set to be a distance between the facing walls of the transfer chamber 140 adjacent to the wall 141a. It is more preferable that the maximum width of the hole 186c is set to be equal to a width of the wall 141a.

It is more preferable that the inert gas supplied through the distributor 186 is heated by the heater 185. By heating the inert gas by the heater 185, it is possible to increase an efficiency of removing the moisture. When the inert gas is supplied, the supply of the inert gas and the stop of the supply of the inert gas may be alternately and repeatedly performed. By repeatedly colliding the moisture with the inert gas, the moisture can be physically removed more efficiently.

<Process Module>

Subsequently, the process modules PM will be described mainly on the reactors RCs. Since the configurations of the process modules PM1 through PM4 are the same, the process module PM serving as one of the process modules PM1 through PM4 will be described below. Similarly, since the configurations of the reactors RC1 through RC8 are the same, the reactor RC serving as one of the reactors RC1 through RC8 will be described below.

A partition wall is provided between the two reactors RCs provided in the process module PM. The partition wall is configured to prevent mixing of inner atmospheres of process spaces 205 of the two reactors RCs. That is, the inner atmospheres of the process spaces 205 are maintained independently.

The reactor RC will be described in detail with reference to FIGS. 4 and 5. Since the configurations of the two reactors RCs provided in the process module are the same, the reactor RC serving as one of the two reactors RCs will be described below. As shown in FIG. 4, the reactor RC includes a vessel 202. For example, the vessel 202 includes a flat and sealed vessel whose horizontal cross-section is circular. The vessel 202 is made of a metal material such as aluminum (Al) and stainless steel (SUS) or quartz. A process chamber 201 defining the process space 205 where the substrate 100 such as a silicon wafer is processed and a transfer chamber 206 defining a transfer space through which the substrate 100 is transferred into or out of the process space 205 are provided in the vessel 202. The vessel 202 is constituted by an upper vessel 202a and a lower vessel 202b. A partition plate 208 is provided between the upper vessel 202a and the lower vessel 202b.

The communication hole 148 is provided adjacent to the gate valve 149 at a side surface of the lower vessel 202b. The substrate 100 is transferred between the transfer chamber 206 and the vacuum transfer chamber 140 through the communication hole 148. Lift pins 207 are provided at a bottom of the lower vessel 202b.

A substrate support 210 configured to support the substrate 100 is provided in the process space 205. The substrate support 210 mainly includes: the substrate mounting table 212 provided with a substrate placing surface 211 on which the substrate 100 is placed; and the heater 213 which is a heating structure embedded in the substrate mounting table 212. Through-holes 214 through which the lift pins 207 penetrate are provided at positions of the substrate mounting table 212 corresponding to the lift pins 207.

Wiring 222 configured to supply the electric power to the heater 213 is connected to the heater 213. The wiring 222 is connected to a heater controller 223. The heater controller 223 is electrically connected to the controller 400. The controller 400 is configured to control the heater controller 223 to operate the heater 213.

The substrate mounting table 212 is supported by a shaft 217. The shaft 217 penetrates the bottom of the vessel 202, and is connected to an elevator 218 at the outside of the vessel 202.

The substrate 100 placed on the substrate placing surface 211 of the substrate mounting table 212 may be elevated or lowered by operating the elevator 218 by elevating and lowering the shaft 217 and the substrate mounting table 212.

For example, the process chamber 201 is constituted by a buffer structure 230 described later and the substrate mounting table 212. The process chamber 201 may be configured by another structure as long as the process space 205 in which the substrate 100 is processed can be secured.

When the substrate 100 is transferred, the substrate mounting table 212 is lowered until the substrate placing surface 211 faces the communication hole 148, that is, until a transfer position P0 is reached. When the substrate 100 is processed, the substrate mounting table 212 is elevated until the substrate 100 reaches a processing position in the process space 205 as shown in FIG. 4.

The buffer structure 230 configure to diffuse a gas is provided in an upper portion (upstream side) of the process space 205. The buffer structure 230 is constituted mainly by a lid 231. A first gas supplier 240 and a second gas supplier 250, which will be described later, are connected to the lid 231 so as to communicate with a gas introduction hole 231a provided in the lid 231. Although the gas introduction hole 231a configured as a single hole is illustrated in FIG. 4, holes serving as the gas introduction hole 231a may be provided with respect to gas suppliers such as the first gas supplier 240 and the second gas supplier 250, respectively.

<Exhauster>

Subsequently, an exhauster (which is an exhaust system) 271 will be described. An exhaust pipe 272 configured to communicate with the process space 205 is provided. The exhaust pipe 272 is connected to the upper vessel 202a so as to communicate with the process space 205. An APC 273 serving as a pressure controller (pressure regulator) is provided at the exhaust pipe 272. The APC 273 is capable of controlling an inner pressure of the process space 205 to a predetermined pressure.

The APC 273 includes a valve body (not shown) whose opening degree can be adjusted. The APC 273 can adjust the conductance of the exhaust pipe 272 in accordance with an instruction from the controller 400. Further, a valve 274 is provided at the exhaust pipe 272 at an upstream side of the APC 273. The exhaust pipe 272, the APC 273 and the valve 274 may be collectively referred to as the exhauster 271.

Further, a dry pump DP 275 is provided at a downstream side of the exhaust pipe 272. The dry pump 275 is capable of exhausting the inner atmosphere of the process space 205 through the exhaust pipe 272.

<Gas Supplier>

Subsequently, a gas supplier (which is a gas supply system) capable of supplying a gas to the process chamber 201 will be described with reference to FIG. 5. The gas supplier described with reference to FIG. 5 may also be referred to as a "process chamber gas supplier" in order to distinguish it from the transfer chamber inert gas supplier described above.

The first gas supplier (which is a first gas supply system) 240 will be described. A first gas supply source 242, a mass flow controller (MFC) 243 serving as a flow rate controller (flow rate control structure) and a valve 244 serving as an opening/closing valve are sequentially provided in order at a first gas supply pipe 241 from an upstream side toward a downstream side of the first gas supply pipe 241.

The first gas supply source 242 is a source of a first gas (also referred to as a "first element-containing gas") containing the first element. The first element-containing gas serves as a source gas, which is one of process gases. In the present embodiment, for example, the first element includes silicon (Si). That is, for example, the first element-containing gas includes a silicon-containing gas. Specifically, a monosilane ($SiH_4$) gas may be used as the silicon-containing gas.

The first gas supplier 240 is constituted mainly by the first gas supply pipe 241, the MFC 243 and the valve 244.

Subsequently, the second gas supplier (which is a second gas supply system) 250 will be described. A second gas supply source 252, a mass flow controller (MFC) 253 serving as a flow rate controller (flow rate control structure) and a valve 254 serving as an opening/closing valve are sequentially provided in order at a second gas supply pipe 251 from an upstream side toward a downstream side of the second gas supply pipe 251.

The second gas supply source 252 is a source of a second gas (also referred to as a "second element-containing gas") containing the second element. The second element-containing gas is one of the process gases. The second element-containing gas may serve as a reactive gas or a modifying gas.

In the present embodiment, the second element-containing gas contains the second element different from the first element. For example, the second element includes an element selected from the group of oxygen (O), nitrogen (N) and carbon (C). The present embodiment will be described by way of an example in which an oxygen-containing gas is used as the second element-containing gas. Specifically, oxygen gas ($O_2$ gas) may be used as the oxygen-containing gas.

The second gas supplier 250 is constituted mainly by the second gas supply pipe 251, the MFC 253 and the valve 254.

When a film is formed on the substrate 100 by using the first gas alone, the second gas supplier 250 may not provided in the substrate processing apparatus 200.

<Controller>

Subsequently, the controller 400 will be described with reference to FIG. 6. The substrate processing apparatus 200 includes the controller 400 configured to control operations of components constituting the substrate processing apparatus 200.

The controller 400, which is a control apparatus (control structure) may be embodied by a computer including a CPU (Central Processing Unit) 401, a RAM (Random Access Memory) 402, a memory 403 serving as a storage and an I/O port (input/output port) 404. The RAM 402, the memory 403 and the I/O port 404 may exchange data with the CPU 401 via an internal bus 405. The transmission/reception of the data in the substrate processing apparatus 200 may be performed by an instruction from a transmission/reception instruction controller 406, which is also one of functions of the CPU 401.

The CPU 401 may further include a determination controller 407. The determination controller 407 is capable of analyzing a relationship between a table stored in the memory 403 and the amount of the moisture measured by the moisture detector 146.

A network transmitter/receiver 283 connected to a host apparatus 270 via a network is provided. For example, the network transmitter/receiver 283 is capable of receiving information regarding a processing history and a processing schedule of the substrate 100 in the lot.

The memory 403 may be embodied by a component such as a flash memory and a HDD (Hard Disk Drive). For example, a recipe 409 such as a process recipe in which information such as the sequences and the conditions of the substrate processing described later is stored are readably stored in the memory 403 and a control program 410 for controlling the operation of the substrate processing apparatus 200 is stored may be readably stored in the memory 403. The memory 403 may further include a moisture information memory 411 capable of recording the data detected by the moisture detector 146 and reading temperature data thereof.

The process recipe is a program that is executed by the controller 400 to obtain a predetermined result by performing the sequences of the substrate processing described later. Hereinafter, the process recipe and the control program may be collectively or individually referred to simply as a "program." In the present specification, the term "program" mayrefer to the process recipe alone, may refer to the control program alone, or may refer to both of the process recipe and the control program. The RAM 402 serves as a memory area (work area) in which the program or the data read by the CPU 401 are temporarily stored.

The I/O port 404 is electrically connected to the components of the process modules PMs described above such as the gate valve 149, the elevator 218, the pressure regulators, the pumps and the heater controller 223.

The CPU 401 is configured to read and execute the control program from the memory 403 and read the process recipe in accordance with an instruction such as an operation command inputted from an input/output device 281. The CPU 401 is configured to control various operations in accordance with the process recipe such as an opening and closing operation of the gate valve 149, an elevating and lowering operation of the elevator 218, an operation of the moisture detector 146, an operation of the heater controller 223, an ON/OFF control operation of each pump, a flow rate adjusting operation of each MFC described above and an operation of each valve described above.

For example, the controller 400 according to the present embodiment may be embodied by preparing an external memory 282 (for example, a magnetic disk such as a hard disk, an optical disk such as a DVD, a magneto-optical disk such as an MO, a semiconductor memory such as a USB memory) storing the program described above and installing the program onto a computer using the external memory 282. The method of providing the program to the computer is not limited to the external memory 282. For example, the program may be directly provided to the computer by a communication means such as the Internet and a dedicated line instead of the external memory 282. The memory 403 and the external memory 282 may be embodied by a non-transitory computer-readable recording medium. Hereinafter, the memory 403 and the external memory 282 are collectively or individually referred to as a recording medium. In the present specification, the term "recording medium" mayrefer to the memory 403 alone, may refer to the external memory 282 alone, or may refer to both of the memory 403 and the external memory 282.

(2) Substrate Processing

Hereinafter, as an example of the substrate processing performed by the substrate processing apparatus 200, a film processing step (also referred to as a film-forming process) of forming a film on the substrate 100 by using the substrate processing apparatus 200 described above and a maintenance step will be described. In the following description, the controller 400 controls the operations of the components constituting the substrate processing apparatus 200.

The substrate processing will be described by way of an example in which the vacuum transfer chamber 140 and the reactor RC among the reactors RCs are used.

<Film Processing Step>

A substrate transfer step, which is a part of one of the film processing step, will be described. The atmospheric transfer robot 122 transfers the substrate 100 out of the pod 111. Then, the atmospheric transfer robot 122 transfers the substrate 100 to the load lock chamber 130. When transferring the substrate 100 to the load lock chamber 130, if there is the processed substrate 100 in the load lock chamber 130, the atmospheric transfer robot 122 transfers the processed substrate 100 to the pod 111.

An inner atmosphere (inner pressure) of the load lock chamber 130 is adjusted to a negative pressure. When the inner pressure of the load lock chamber 130 is adjusted to the same pressure level as the inner pressure of the vacuum transfer chamber 140, the gate valve 134 is opened. The robot 170 picks up the unprocessed substrates 100 in the load lock chamber 130 and transfers it to each of the reactors RCs. When transferring the unprocessed substrates 100 to each of the reactors RCs, the moisture adhering to the unprocessed substrates 100 may be diffused into the vacuum transfer chamber 140.

After processing the substrates 100 for a predetermined time in each of the reactors RCs, the gate valve 149 is opened. Then, the robot 170 replaces the processed substrate 100 in the reactor RC with the unprocessed substrate 100 supported by the robot 170, and transfers (loads) the unprocessed substrate 100 into the reactor RC.

The robot 170 transfers (loads) the processed substrate 100 into the load lock chamber 130.

While performing the operations described above, the moisture detector 146 detects the amount of the moisture in the vacuum transfer chamber 140. When the amount of the moisture is equal to or greater a predetermined value, the maintenance step is performed before the next substrate are processed or before the substrates of the next lot are processed. When the amount of the moisture is less than the predetermined value, the substrates 100 are continuously processed.

Subsequently, the operation in the reactor RC when processing the substrate 100 will be described.

The substrate mounting table 212 is lowered to a position of transferring the substrate 100 (that is, the transfer position P0) such that the lift pins 207 penetrate through the through-holes 214 of the substrate mounting table 212. As a result, the lift pins 207 protrude from the surface of the substrate mounting table 212 by a predetermined height. In parallel with the operation of lowering the substrate mounting table 212, an inner atmosphere of the transfer chamber 206 is exhausted such that an inner pressure of the transfer chamber 206 is the same as that of the vacuum transfer chamber 140 provided adjacently or lower than that of the vacuum transfer chamber 140 provided adjacently.

Subsequently, the gate valve 149 is opened to communicate the transfer chamber 206 with the vacuum transfer chamber 140 provided adjacently. Then, the robot 170 loads the substrate 100 from the vacuum transfer chamber 140 into the transfer chamber 206 and places the substrate 100 on the lift pins 207.

After the substrate 100 is placed on the lift pins 207, the substrate mounting table 212 is elevated until the substrate 100 is placed on the substrate placing surface 211. Then, the substrate mounting table 212 is further elevated until the substrate 100 reaches the processing position as shown in FIG. 4.

When the substrate 100 is being placed on the substrate placing surface 211, the electric power is supplied to the heater 213 such that a temperature of the surface of the substrate 100 is adjusted to a predetermined temperature. For example, the temperature of the surface of the substrate 100 is adjusted to the predetermined temperature equal to or greater than the room temperature and equal to or less than 800° C., preferably, equal to or greater than the room temperature and equal to or less than 500° C. When heating the substrate 100 to the predetermined temperature, the wall 141b is also heated.

Subsequently, a process gas supply step, which is a part of one of the film processing step, will be described. When the substrate 100 is heated and reaches a desired temperature, the first gas and the second gas are supplied to the process chamber 201. As a method of supplying the first gas and the second gas, for example, the first gas and the second gas are supplied simultaneously or supplied alternately to form a desired film. In the present embodiment, for example, the desired film may refer to a silicon oxide film.

When the desired film is formed on the substrate 100, the substrate 100 is transferred (unloaded) out of the process chamber 201 in the order reverse to that of the loading of the substrate 100 described above. Since the amount of the moisture in the transfer chamber 140 is less than predetermined value described above, it is possible to suppress the reduction of the yield.

<Maintenance Step>

Subsequently, the maintenance step will be described. When the determination controller 407 determines that the amount of the moisture detected by the moisture detector 146 is equal to or greater than the predetermined value described above, the maintenance step is performed. The maintenance step is performed while the substrate 100 is not present in the transfer chamber 140 and the operation related to the processing of the substrate 100 is stopped. For example, operations such as an operation of supplying the gas to the process chamber 201 and an operation of transferring the substrate 100 are stopped when the maintenance step is performed.

In the maintenance step, the inert gas supplier 180 and the exhauster 160 are operated. By supplying the inert gas into the housing 141, the moisture adhering to the low temperature location of the housing 141 is removed. According to the present embodiment, the moisture adhering to the wall 147a is removed by supplying the inert gas through the hole 186b of the distributor 186 toward the wall 147a which serves as the low temperature location. Specifically, the inert gas is supplied to the wall 147a of the ceiling 147, which constitutes the low temperature region. After a predetermined time has elapsed, the supply of the inert gas is stopped.

When the distributor 186 is provided with the hole 186c, the inert gas may be supplied in the direction of the wall 141a to remove the moisture adhering to the wall 141a.

In the maintenance step, a supply amount of the inert gas may be controlled based on the information on the amount of the moisture detected by the moisture detector 146. For example, when the determination controller 407 determines that the amount of the moisture detected by the moisture detector 146 is greater than the predetermined value, it is determined that the amount of the moisture adhering to the low temperature location is large, and the supply amount of the inert gas may be increased. Thereby, it is possible to reliably remove the moisture.

For example, when the determination controller 407 determines that the amount of the moisture detected by the moisture detector 146 is lower than the predetermined value, it is determined that the amount of the moisture adhering to the low temperature location is small, and the supply amount of the inert gas may be decreased. Thereby, it is possible to suppress the supply amount of the inert gas, and it is also possible to reduce the cost related to the amount of the inert gas used in the maintenance step.

When controlling the supply amount of the inert gas based on the information of the amount of the moisture detected by the moisture detector 146, for example, the moisture information memory 411 may store in advance a table in which the amount of the moisture and the supply amount of the inert gas are related. In such a case, the determination controller 407 may determine the supply amount of the inert gas by comparing the amount of the moisture detected by the moisture detector 146 and the table stored in advance in the moisture information memory 411.

According to the present embodiment, the supply of the inert gas is stopped after a predetermined time has elapsed. However, the technique of the present disclosure is not limited thereto. For example, the supply of the inert gas may be stopped when it is determined that the amount of the moisture detected by the moisture detector 146 is equal to or less than the predetermined value.

Second Embodiment

Figure 7:
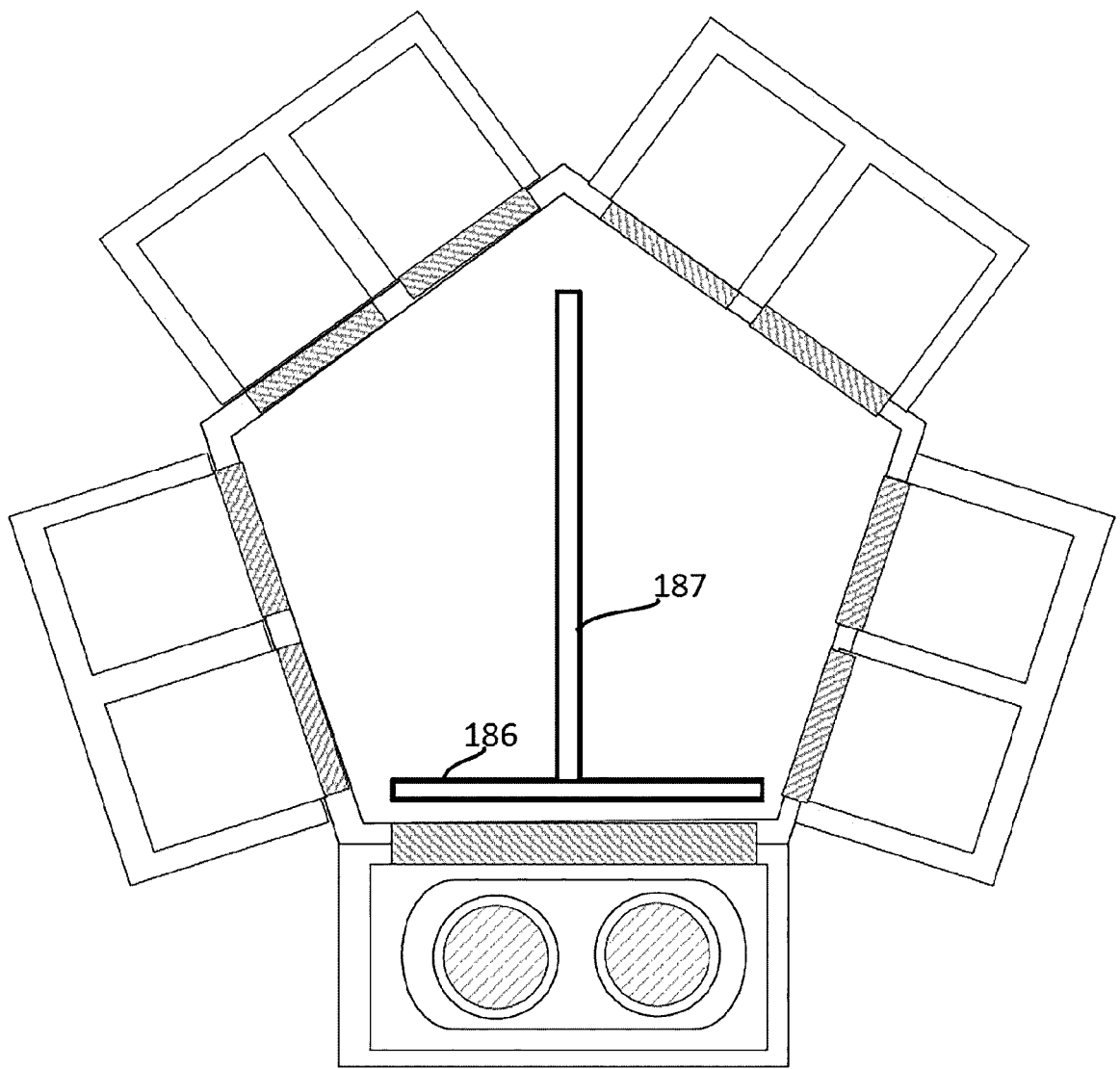
FIG. 7 schematically illustrates a horizontal cross-section of a substrate processing apparatus according to a second embodiment described herein.
Figure 8:
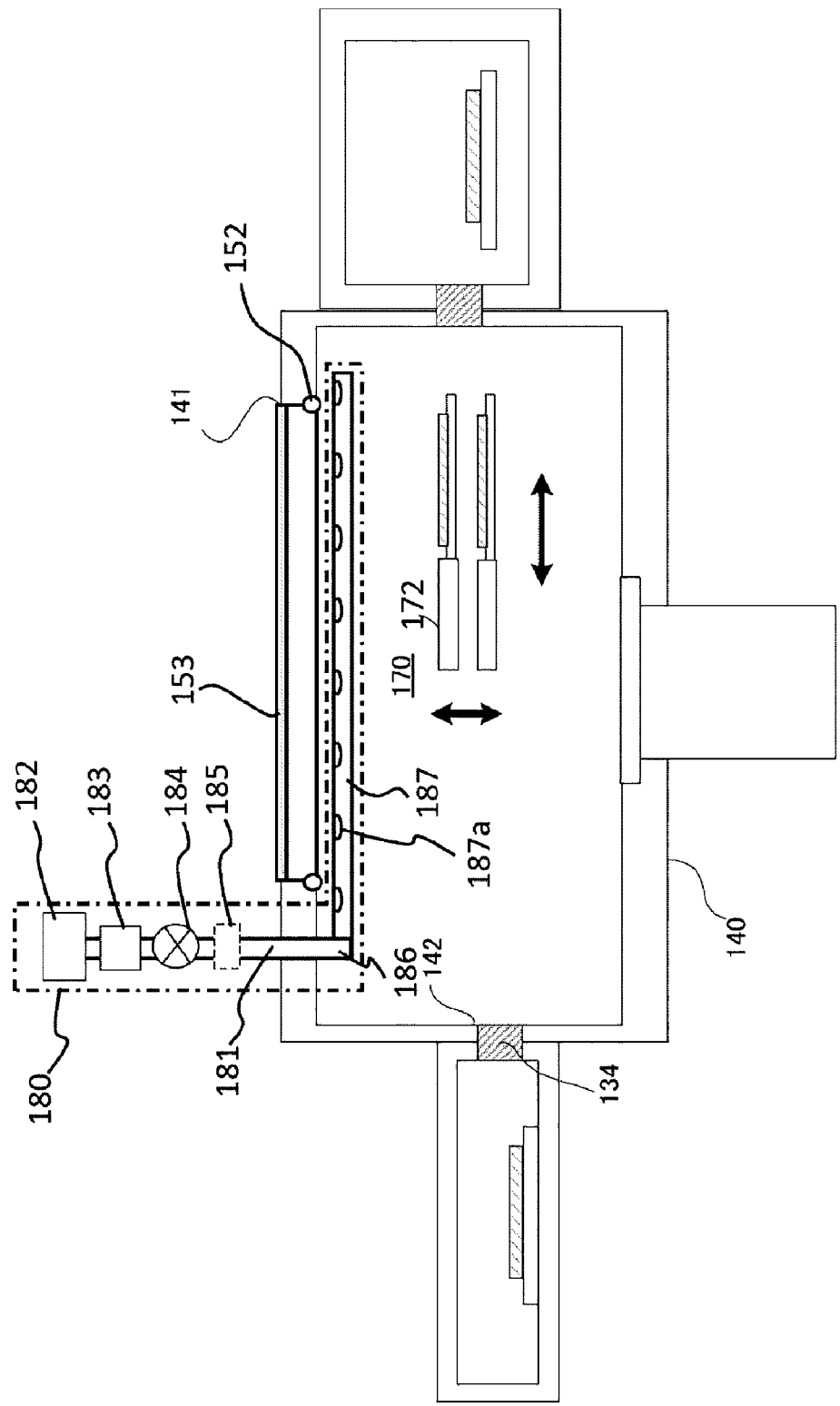
FIG. 8 schematically illustrates a vertical cross-section of the substrate processing apparatus according to the second embodiment described herein.

Subsequently, a second embodiment according to the technique of the present disclosure will be described with reference to FIGS. 7 and 8. A structure of the distributor 186 of the second embodiment is different from that of the first embodiment. In the present embodiment, the distributor 186 is further provided with a nozzle 187 which is an elongated structure. Hereinafter, the distributor 186 and the nozzle 187 of the second embodiment will be mainly described. Since other configurations of the second embodiment are the same as those of the first embodiment, the description thereof will be omitted. Further, the low temperature region (second region) in the present embodiment may refer to a central region of the wall 147a, which will be described later.

The distributor 186 in the present embodiment is provided with the nozzle 187 instead of providing the hole 186b shown in FIG. 3. The nozzle 187 communicates with the inert gas supply pipe 181 via the distributor 186. The nozzle 187 is provided with a hole 187a through which the inert gas is ejected (discharged). The hole 187a is open toward the wall 147a. The nozzle 187 extends along the ceiling 147.

The nozzle 187 is configured such that the inert gas can be supplied toward at least a central portion (that is, the central region) of the wall 147a. As described above, the central portion of the wall 147a is separated from each of the reactors RCs. Therefore, a temperature of the central portion of the wall 147a tends to be lowered and the moisture may easily adhere to the central portion of the wall 147a. However, with the configuration such as the nozzle 187 described above, it is possible to reliably supply the inert gas to the center of the wall 147a. Thereby, it is possible to remove the moisture adhering to the central portion of the wall 147a.

Third Embodiment

Subsequently, a third embodiment according to the technique of the present disclosure will be described with reference to FIG. 9. A structure of the distributor 186 of the third embodiment is different from that of the first embodiment. Opening directions of holes in the distributor 186 of the third embodiment are different from that in the distributor 186 of the first embodiment. Hereinafter, the distributor 186 of the third embodiment will be mainly described. Since other configurations of the third embodiment are the same as those of the first embodiment, the description thereof will be omitted. Further, the low temperature region (second region) in the present embodiment may refer to a region constituted by walls interposed between a plurality of process chambers including the process chamber 201 or walls interposed between the load lock chamber 130 and the plurality of the process chambers including the process chamber 201 as described later.

Figure 9:
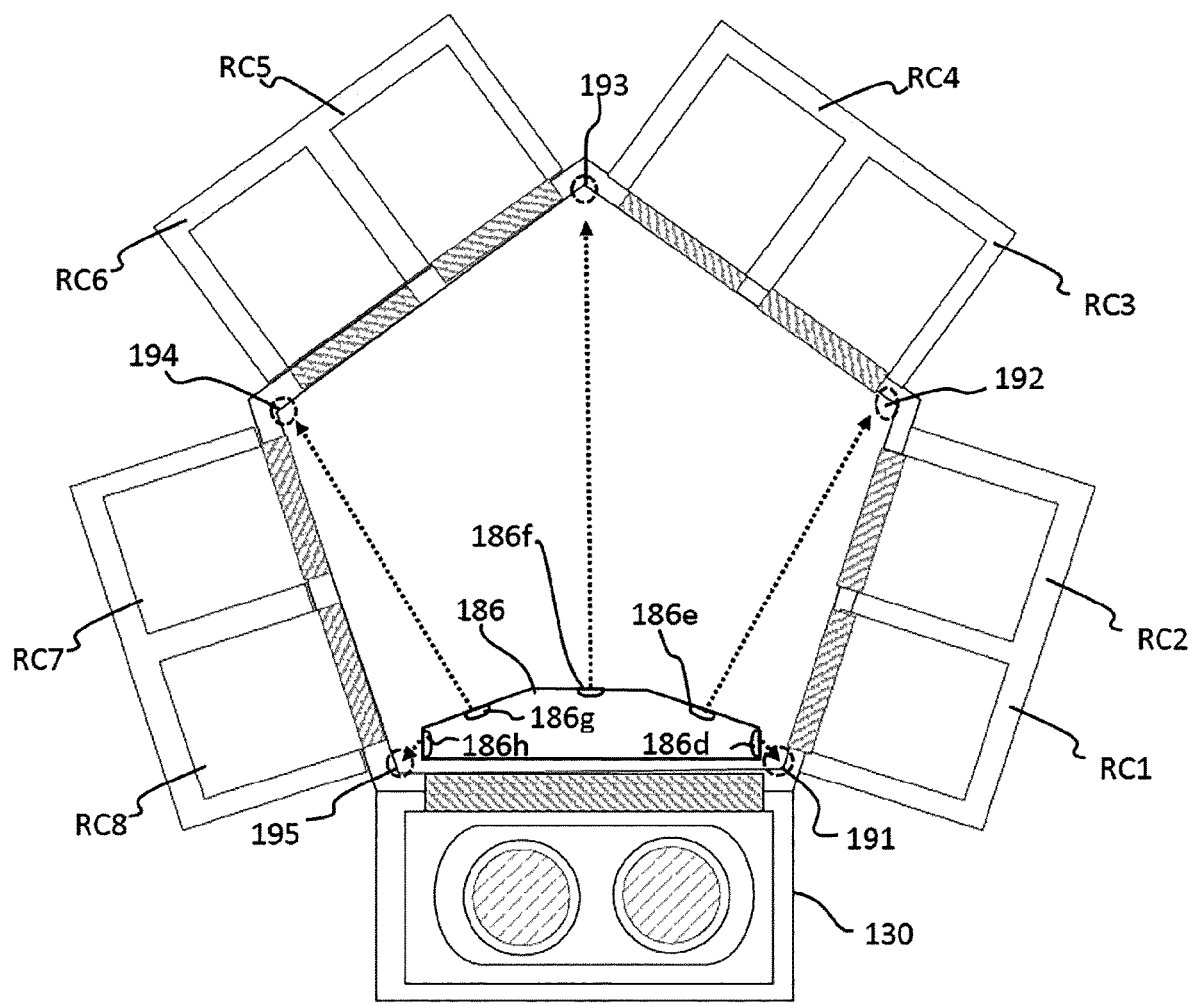
FIG. 9 schematically illustrates a horizontal cross-section of a substrate processing apparatus according to a third embodiment described herein.

As shown in FIG. 9, the distributor 186 of the present embodiment is provided with holes 186d, 186e, 186f, 186g and 186h. Subsequently, opening direction of the holes 186d through 186h will be described. The holes 186d through 186h are opened so that the inert gas can be supplied to the low temperature location such as a wall 191, a wall 192, a wall 193, a wall 194 and a wall 195, as described by arrows shown in FIG. 9.

Subsequently, the wall 191, the wall 192, the wall 193, the wall 194 and the wall 195 will be described. As described above, the temperature of the housing 141 in the vicinity of the reactor RC is high due to the influence of the heater 213. In particular, the temperature in the vicinity of the communication hole 148 configured to communicate with the reactor RC and the housing 141 or the temperature of the wall 141b at which the communication hole 148 is provided may be high. However, the wall 191, the wall 192, the wall 193, the wall 194 and the wall 195, which are provided between the adjacent reactors RCs or between the reactor RC and the load lock chamber 130 are less affected by the heater 213. As a result, the temperatures of the walls 191 through 195 are lower than the temperature in the vicinity of the communication hole 148. In particular, when the chiller or the cooling water is flowing through the housing 141, the temperatures of the walls 191 through 195 are further lowered. Then, the moisture may easily adhere to the walls 191 through 195.

Therefore, according to the present embodiment, a structure is provided such that the inert gas can be supplied to the walls interposed between the adjacent reactors RCs or between the reactor RC and the load lock chamber 130 (that is, the walls 191 through 195) so as to remove the moisture adhering to the walls 191 through 195.

Specifically, for the wall 191 adjacent to the load lock chamber 130 and the reactor RC1, the hole 186d is configured to face the wall 191 so that the inert gas can be supplied to the wall 191. For the wall 192 adjacent to the reactor RC2 and the reactor RC3, the hole 186e is configured to face the wall 192 so that the inert gas can be supplied to the wall 192. For the wall 193 adjacent to the reactor RC4 and the reactor RC5, the hole 186f is configured to face the wall 193 so that the inert gas can be supplied to the wall 193. For the wall 194 adjacent to the reactor RC6 and the reactor RC7, the hole 186g is configured to face the wall 194 so that the inert gas can be supplied to the wall 194. For the wall 195 adjacent to the load lock chamber 130 and the reactor RC8, the hole 186h is configured to face the wall 195 so that the inert gas can be supplied to the wall 195.

In the distributor 186 according to the present embodiment, surfaces facing the wall 191, the wall 192, the wall 193, the wall 194 and the wall 195 are provided so that the holes 186d through 186h can be configured, and each of the holes 186d through 186h is provided on the surfaces. With such a configuration, it is possible to reliably remove the moisture adhering to the walls interposed between the adjacent reactors RCs or between the reactor RC and the load lock chamber 130 (that is, the walls 191 through 195). Since the wall 191, the wall 192, the wall 193, the wall 194 and wall 195 are arranged between the communication holes, the walls 191 through 195 may also be referred to as "walls between the communication holes".

Fourth Embodiment

Figure 10:
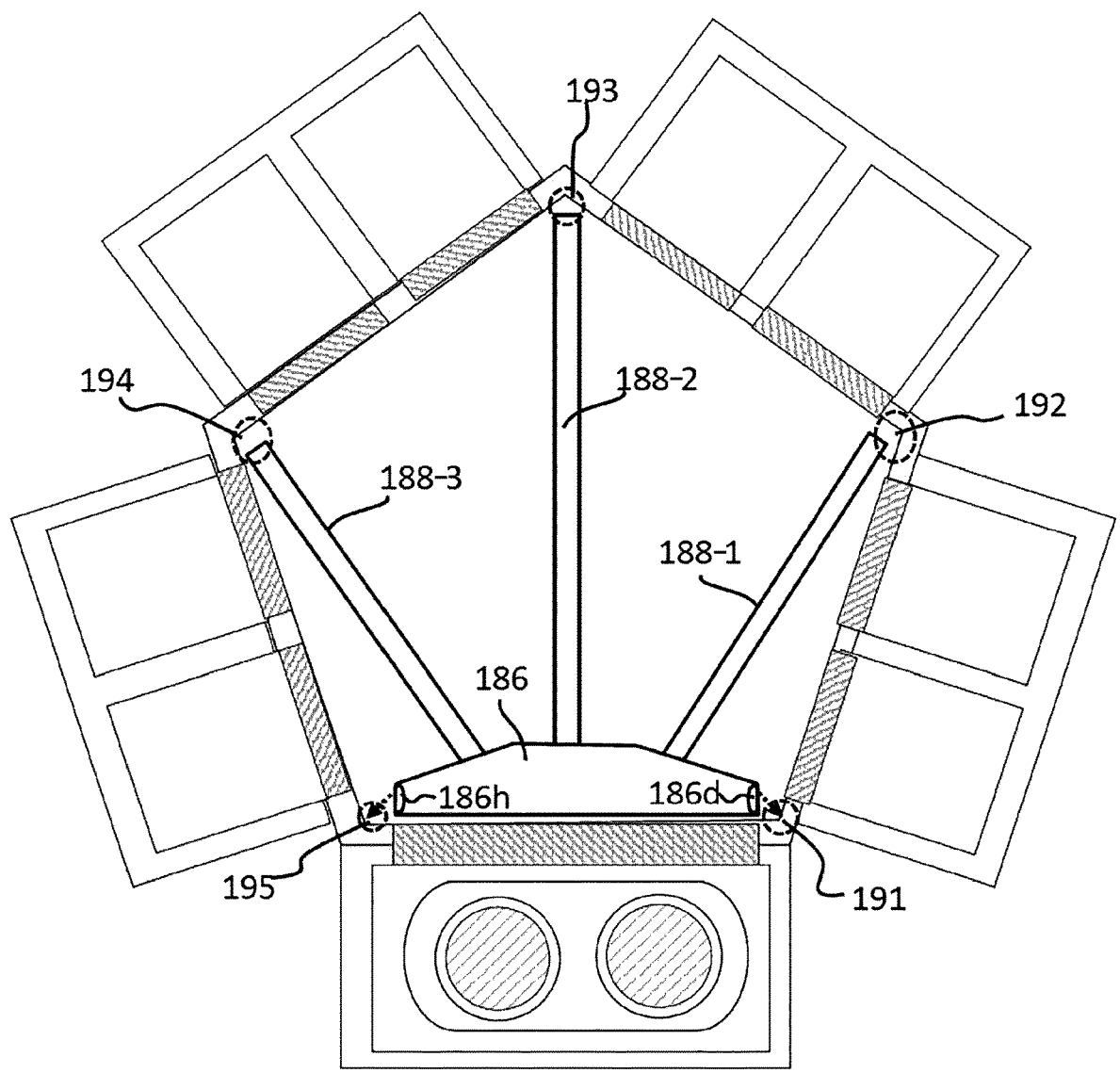
FIG. 10 schematically illustrates a horizontal cross-section of a substrate processing apparatus according to a fourth embodiment described herein.

Subsequently, a fourth embodiment according to the technique of the present disclosure will be described with reference to FIGS. 10 and 11. A structure of the distributor 186 of the fourth embodiment is different from that of the third embodiment. In the present embodiment, the distributor 186 is further provided with a plurality of nozzles (for example, a nozzle 188-1, a nozzle 188-2 and a nozzle 188-3) which is an elongated structure. The nozzles 188-1 through 188-3 may be collectively referred to as nozzles 188. Hereinafter, the distributor 186 and the nozzles 188 of the fourth embodiment will be mainly described. Since other configurations of the fourth embodiment are the same as those of the third embodiment, the description thereof will be omitted. Further, the low temperature region (second region) in the present embodiment may refer to the region constituted by the walls interposed between the plurality of the process chambers including the process chamber 201 or the walls interposed between the load lock chamber 130 and the plurality of the process chambers including the process chamber 201 as described later.

Similar to the third embodiment, the distributor 186 of the present embodiment is provided with the hole 186d and the hole 186h. Similar to the third embodiment, the hole 186d is configured to supply the inert gas toward the wall 191, and the hole 186h is configured to supply the inert gas toward the wall 195.

Instead of the hole 186e of the third embodiment, the nozzle 188-1 is provided. Instead of the hole 186f of the third embodiment, the nozzle 188-2 is provided. Instead of the hole 186g of the third embodiment, the nozzle 188-3 is provided. As shown in FIG. 11, a plurality of holes 188b are provided at tips (front ends) of the nozzles 188, respectively. The plurality of the holes 188b are arranged in the vicinity of the wall 192, the wall 193 and the wall 194. The plurality of the holes 188b are configured to supply the inert gas toward the wall 192, the wall 193 and the wall 194.

With such a configuration, it is possible to reliably transfer the inert gas to the wall 192, the wall 193 and the wall 194. Therefore, it is possible to more reliably remove the moisture adhering to the low temperature location between the adjacent reactors RCs.

Figure 11:
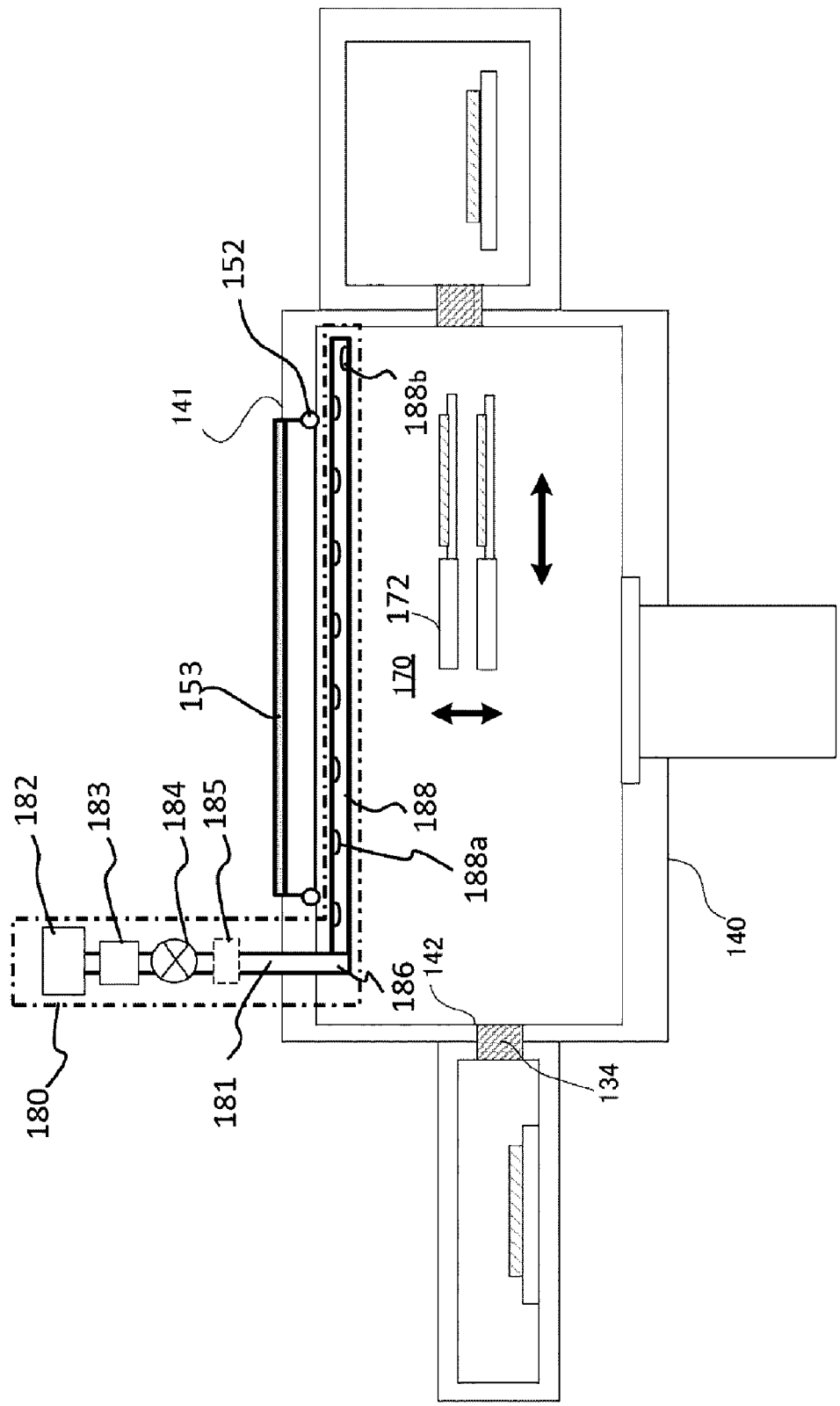
FIG. 11 schematically illustrates a vertical cross-section of the substrate processing apparatus according to the fourth embodiment described herein.

Further, as shown in FIG. 11, in each nozzle 188, a plurality of holes 188a may be provided between a hole among the plurality of the holes 188b and the distributor 186. Similar to the hole 187a shown in FIG. 8, the plurality of the holes 188a are configured to supply the inert gas toward the wall 147a. With such a configuration, it is possible to remove the moisture adhering to the wall 147a.

According to the present embodiment, the inert gas is transferred (supplied) from the wall 192 to the wall 194 using the nozzles 188. However, the technique of the present disclosure is not limited thereto. For example, the inert gas may be directly supplied to each space from the wall 147a. For example, the ceiling 147 may be provided with an inert gas supply hole capable of supplying the inert gas in an upper portion of each space, and the inert gas may be supplied to each space from the inert gas supply hole.

Other Embodiments

While the technique is described in detail by way of the embodiments, the above-described technique is not limited thereto. The above-described technique may be modified in various ways without departing from the gist thereof.

For example, the above-described embodiments are described by way of an example in which the film is formed by using the monosilane gas as the first element-containing gas (first gas) and using the $O_2$ gas as the second element-containing gas (second gas) in the film-forming process performed by the substrate processing apparatus 200. However, the above-described technique is not limited thereto. For example, the above-described technique may also be applied to film-forming processes wherein other gases are used to form different films.

While the embodiments are described by way of an example in which the film-forming process is performed using two types of gases, that is the first gas and the second gas, the above-described technique is not limited thereto. For example, the above-described technique may also be applied to film-forming processes using one type of gas alone or three or more types of gases.

As described above, according to some embodiments in the present disclosure, it is possible to reduce the amount of the moisture in the low temperature region in the substrate processing apparatus provided with the transfer chamber.

What is claimed is:

1. A substrate processing apparatus comprising:
   a process chamber provided with a heater;
   a load lock chamber;
   a transfer chamber provided between the process chamber and the load lock chamber and comprising a first region provided adjacent to the process chamber and a second region provided more adjacent to the load lock chamber than the first region and whose temperature is lower than a temperature of the first region, wherein the second region is a ceiling or a part of a sidewall of the transfer chamber; and
   an inert gas supplier comprising a supply hole capable of supplying an inert gas toward the second region in the transfer chamber while a substrate is not present in the transfer chamber.

2. The substrate processing apparatus of claim 1, further comprising:
   a window provided at the ceiling of the transfer chamber; and a seal provided between the window and a wall constituting the ceiling,
wherein the second region comprises the ceiling, and the inert gas is capable of being supplied through the supply hole toward the wall constituting the ceiling.

3. The substrate processing apparatus of claim 1, further comprising:
a window provided at the ceiling of the transfer chamber; and
a seal provided between the window and a wall constituting the ceiling,
wherein the seal is provided in the second region, and the inert gas is capable of being supplied through the supply hole toward the seal.

4. The substrate processing apparatus of claim 1, wherein the inert gas supplier further comprises
an elongated structure configured to communicate with the inert gas supplier and extending along the ceiling of the transfer chamber,
wherein the elongated structure is provided with the supply hole through which the inert gas is capable of being supplied.

5. The substrate processing apparatus of claim 1, wherein the inert gas supplier further comprises
an elongated structure configured to communicate with the inert gas supplier and extending along the ceiling of the transfer chamber,
wherein the elongated structure is provided with the supply hole through which the inert gas is capable of being supplied toward the ceiling.

6. The substrate processing apparatus of claim 1, wherein the inert gas supplier further comprises an elongated structure configured to communicate with the inert gas supplier and extending along the ceiling of the transfer chamber,
wherein the second region comprises a central region of the ceiling.

7. The substrate processing apparatus of claim 1, wherein the transfer chamber comprises sidewalls comprising the sidewall provided adjacent to the load lock chamber among the sidewalls, and the second region comprises the part of the sidewall.

8. The substrate processing apparatus of claim 1, wherein the second region comprises a communication hole installed on the sidewall and configured to communicate with the load lock chamber and the transfer chamber, and the inert gas supplier is provided with the supply hole through which the inert gas is capable of being supplied toward the communication hole.

9. The substrate processing apparatus of claim 8, wherein a width of the supply hole is greater than a width of the communication hole.

10. The substrate processing apparatus of claim 9, wherein the process chamber comprises a plurality of process chambers, and the second region comprises sidewalls interposed between the plurality of process chambers or sidewalls interposed between the load lock chamber and the process chamber.

11. The substrate processing apparatus of claim 1, wherein the second region comprises sidewalls between a plurality of communication holes configured to communicate with the transfer chamber and the process chamber.

12. The substrate processing apparatus of claim 1, wherein the second region comprises sidewalls interposed between a plurality of communication holes configured to communicate with the transfer chamber and the process chamber, the supply hole is provided at an upper portion of the sidewalls interposed between the plurality of communication holes, and the inert gas is capable of being supplied through the communication holes toward the sidewalls interposed between the plurality of communication holes.

13. The substrate processing apparatus of claim 1, wherein the inert gas supplier further comprises
an elongated structure configured to communicate with the inert gas supplier and extending toward the second region,
wherein the process chamber comprises a plurality of process chambers, the second region comprises sidewalls interposed between the plurality of process chambers or sidewalls interposed between the load lock chamber and the process chamber, and the elongated structure is capable of supplying the inert gas to the second region.

14. The substrate processing apparatus of claim 1, wherein the inert gas supplier comprises a heater capable of heating the inert gas.

15. The substrate processing apparatus of claim 1, wherein the inert gas supplier is controlled such that a supply of the inert gas and a stop of the supply of the inert gas are alternately and repeatedly performed.

16. The substrate processing apparatus of claim 1, wherein the inert gas supplier is configured to supply the inert gas to the transfer chamber while the substrate is not present in the transfer chamber.

17. The substrate processing apparatus of claim 1, wherein the inert gas supplier is configured to start supplying the inert gas to the transfer chamber and to stop supplying the inert gas when an amount of moisture detected by a detector is equal to or less than a predetermined value after a supply of the inert gas is started.

18. The substrate processing apparatus of claim 1, wherein a medium capable of adjusting a temperature is supplied to the sidewall of the transfer chamber.

19. A method of manufacturing a semiconductor device, comprising:
processing the substrate by using the substrate processing apparatus of claim 1.

20. A non-transitory computer-readable recording medium storing a program that when executed by a processor of the substrate processing apparatus causes the substrate processing apparatus to perform the method of claim 19.

* * * * *